United States Patent [19]

Castagna

[11] 4,173,941
[45] Nov. 13, 1979

[54] RESPONSE TRACER AUDIO EQUALIZER AMPLIFIER UNIT HAVING GRAPHIC RESPONSE DISPLAY

[75] Inventor: John F. Castagna, Brooklyn, N.Y.

[73] Assignee: Sparkomatic Corporation, Milford, Pa.

[21] Appl. No.: 914,064

[22] Filed: Jun. 8, 1978

[51] Int. Cl.$^2$ .............................................. H03G 1/00
[52] U.S. Cl. .................................... 116/307; 116/322; 116/323
[58] Field of Search ................... 116/135, 136, 124 R; 333/28 T; 33/1 C, 174 PA, 176, 177, 1 G, 1 AA

[56] References Cited

U.S. PATENT DOCUMENTS

| 1,141,640 | 6/1915 | Huguenin | 33/176 |
| 1,579,702 | 4/1926 | Gottschalk | 33/176 |
| 2,612,557 | 9/1952 | Turner | 116/135 |

Primary Examiner—S. Clement Swisher
Assistant Examiner—Denis E. Corr
Attorney, Agent, or Firm—Mason, Fenwick & Lawrence

[57] ABSTRACT

A response tracer audio equalizer booster amplifier unit having graphic display of frequency response characteristics for variably boosting the power of output signals from an audio frequency signal source to speakers of a stereo sound system or the like, having a cabinet enclosing audio amplifier circuitry for variably boosting the audio signal at plural frequency bands in the audio spectrum, a manually adjustable slide control for each band adjustable along horizontal fore-and-aft paths for varying the signal boosting at the frequency bands, and a graphic display window having markings for the frequency bands and a continuous flexible curve indicator wire variably shaped to simulate a frequency response curve. Motion translating flexible coupling members are moved by the slide to shape the wire to indicate the frequency response curve.

11 Claims, 7 Drawing Figures

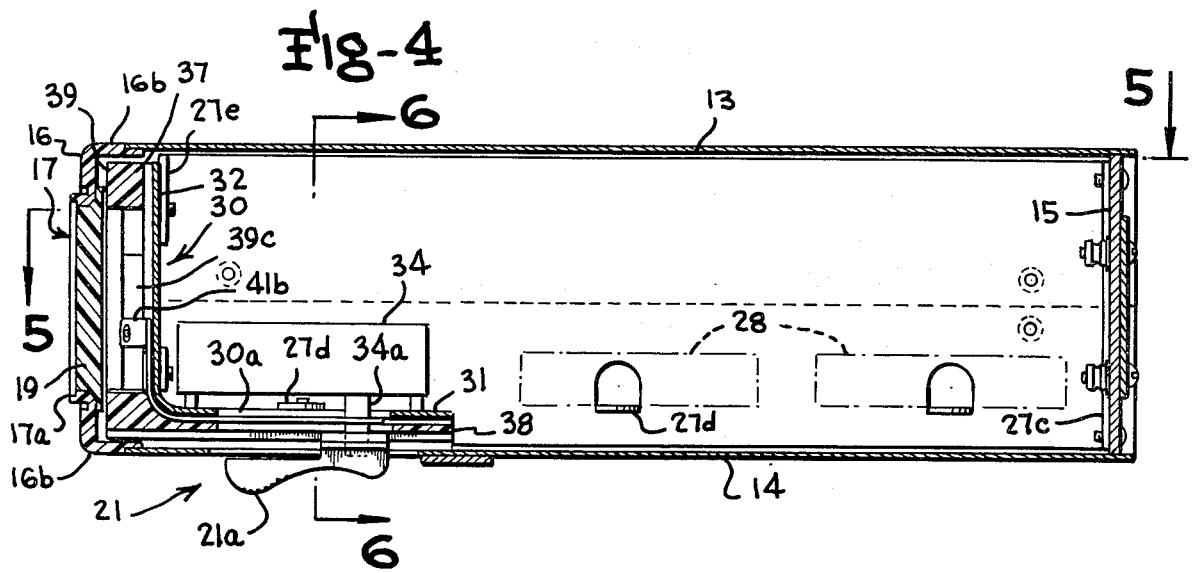
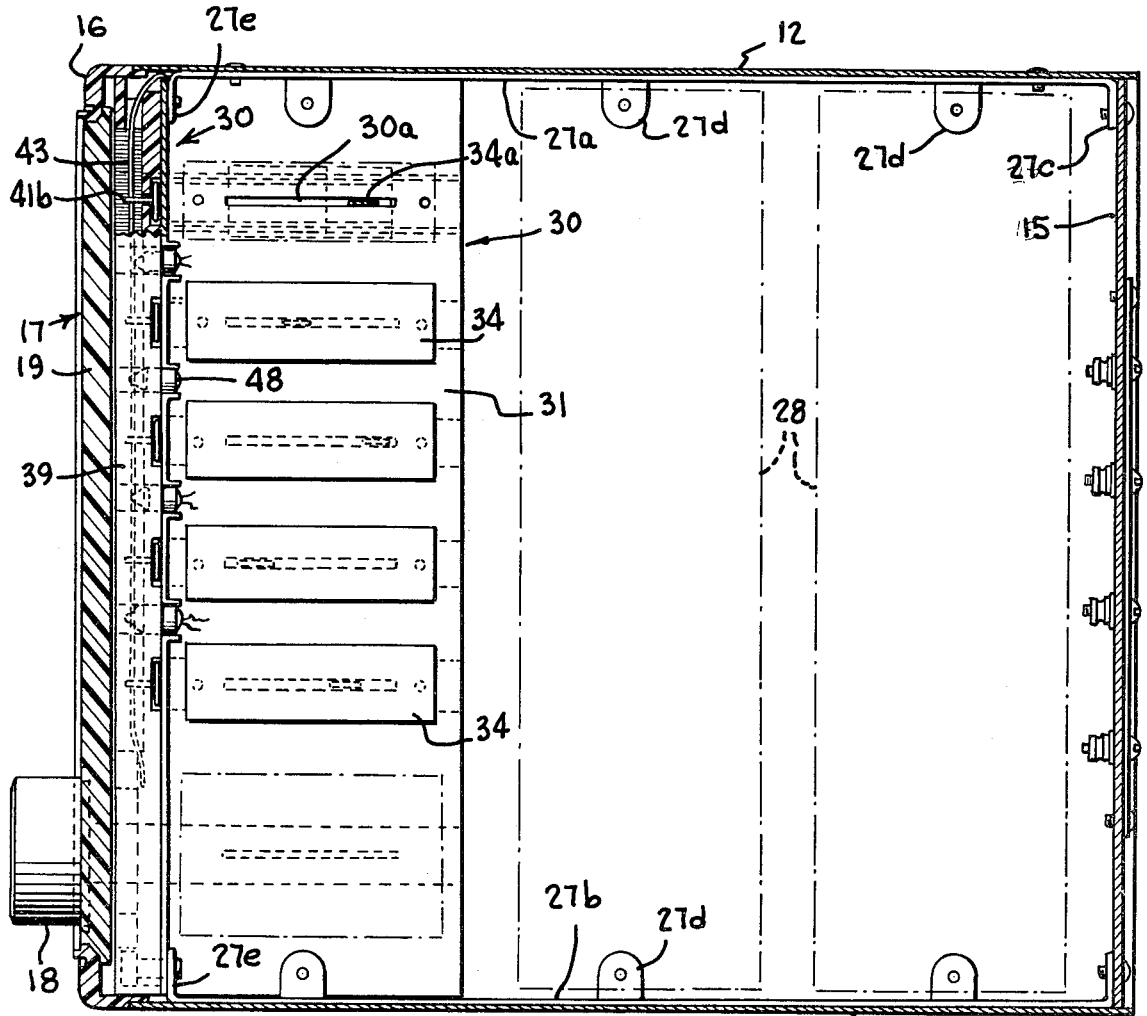

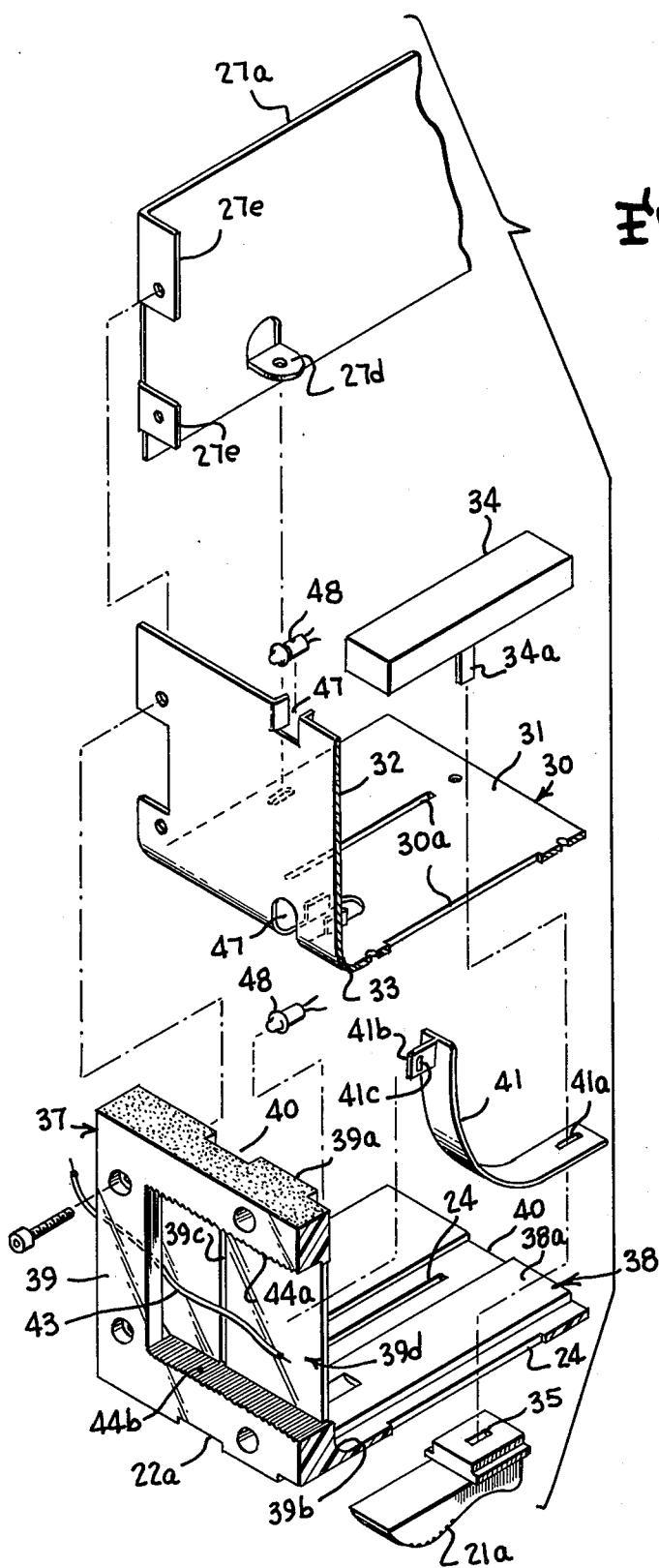
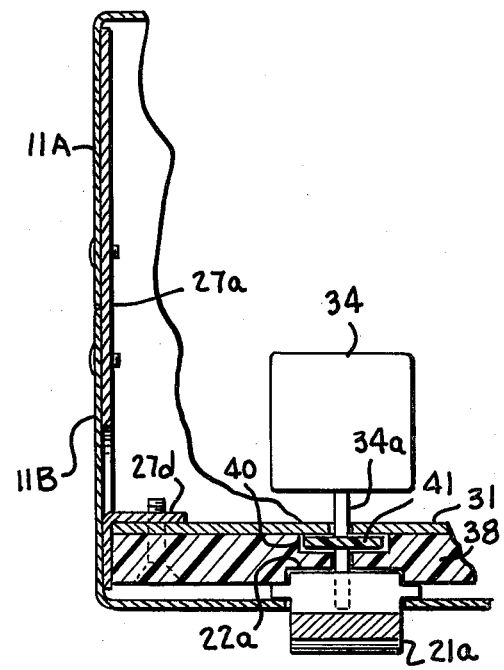
Fig-7
Fig-6

4,173,941

RESPONSE TRACER AUDIO EQUALIZER AMPLIFIER UNIT HAVING GRAPHIC RESPONSE DISPLAY

BACKGROUND AND OBJECTS OF THE INVENTION

The present invention relates in general to power booster amplifier units for boosting the output of a radio receiver or sound signal amplifier before application to one or a plurality of speakers and including means for varying the response in various bands of the audio or sound frequency spectrum, and more particularly to a response tracer amplifier for boosting the power between a radio receiver or audio signal amplifier system to boost the power of driving signals applied to one or more speakers, wherein individually operable controls are provided to raise and lower the output of the response tracer amplifier at a plurality of frequency bands within the audio spectrum and wherein a graphic amplifier response display is provided for visual observation by the operator to indicate visually by a continuous graph curve the amount of boosting and cutting of the signal level in a plurality of frequency bands over the sound frequency spectrum.

Heretofore, high quality amplifiers, for stereo sound systems and plural speaker sound systems and the like, either for use in the home or in automobiles or other listening spaces, have usually employed a bass control and a treble control to manually adjust the "tone" of the high quality amplifier. These controls raise and lower the output of the amplifier at the low and high frequency ends of the audio spectrum. These are provided to compensate for room acoustics, speakers that are deficient in response, tone quality discrepancies that may be caused by program source quality, or generally to please individual tastes in listening. Some amplifiers have provided more than two controls to adjust for "tone". In some instances, as many as five or ten controls have been used, each working over a small frequency range or band within the audio spectrum, thereby giving more possibilities for tone adjustment. By adjustment of the individual controls for each of the plurality of small frequency bands, the bands may be cut or boosted independently over a substantial range of decibels, to effectively modify the tonal quality of the stereo or plural speaker system, tailor the frequency response of the system to the room acoustics for more accurate reproduction, enhance the tonal characteristics and compensate for frequency aberations of the recordings, and the like. Devices have been proposed wherein the controls are in the form of linear operating slide knobs movable vertically through slots allegated to various frequency ranges, so that the pattern of the slide control knobs form a series of intermittent dots or circles at spaced locations along a path generally indicating the response curve for which the amplifier or amplifier channel has been set. However, these slide control knobs work in parallel slots which are laterally spaced from each other, so that when they are adjusted, the response of the amplifier can only be visualized by mentally drawing a line through the different positions of the controls.

An object of the present invention is the provision of a novel response tracer audio equalizer booster amplifier for plural channel stereo systems, such as radio or stereo phonograph systems, having a plurality of manually adjustable tone controls to vary the amount of boosting and cutting of the particular frequency bands associated with each of the tone controls, and wherein the tone controls are linked to a flexible rod of a response tracer display acting as a curve line on a graph to provide an observable trace display as a continuous line indicating the frequency response curve determined by the control settings.

Another object of the present invention is the provision of a graphic display response tracer audio equalizer amplifier for boosting the power output from plural channel stereo radio or amplifier systems and the like between the system amplifier and the speakers, wherein a continuous curve similar to the trace on an oscilloscope or graph is formed by a flexible rod formed into a curve in accordance with the setting of the plurality of linear operating control slide knobs or the like adjusting the response of the plurality of individual controlled frequency bands in the audio frequency range, to give an actual visual presentation of the audio response curve for which the amplifier unit has been set.

Other objects, advantages and capabilities of the present invention will become apparent from the following detailed description, taken in conjunction with the accompanying drawings illustrating a preferred embodiment of the invention.

BRIEF DESCRIPTION OF THE FIGURES

FIG. 4 is a vertical longitudinal section view thereof, taken along the line 4—4 of FIG. 2;

FIG. 5 is a horizontal longitudinal section view taken on the line 5—5 of FIG. 4;

FIG. 6 is a fragmentary section view along the line 6—6 of FIG. 4; and

FIG. 7 is an exploded fragmentary perspective view of one of the control push-knobs and the flexible strap and associated mechanism therefor for positioning the curve indicator wire.

DETAILED DESCRIPTION OF A PREFERRED EMBODIMENT

Figure 2:
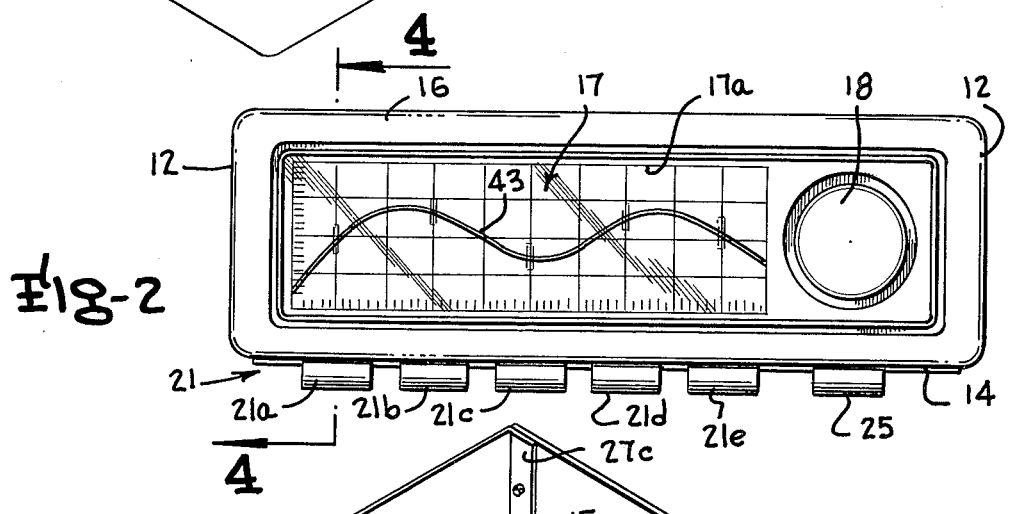
FIG. 2 is a front elevation view of the response tracer amplifier.
Figure 3:
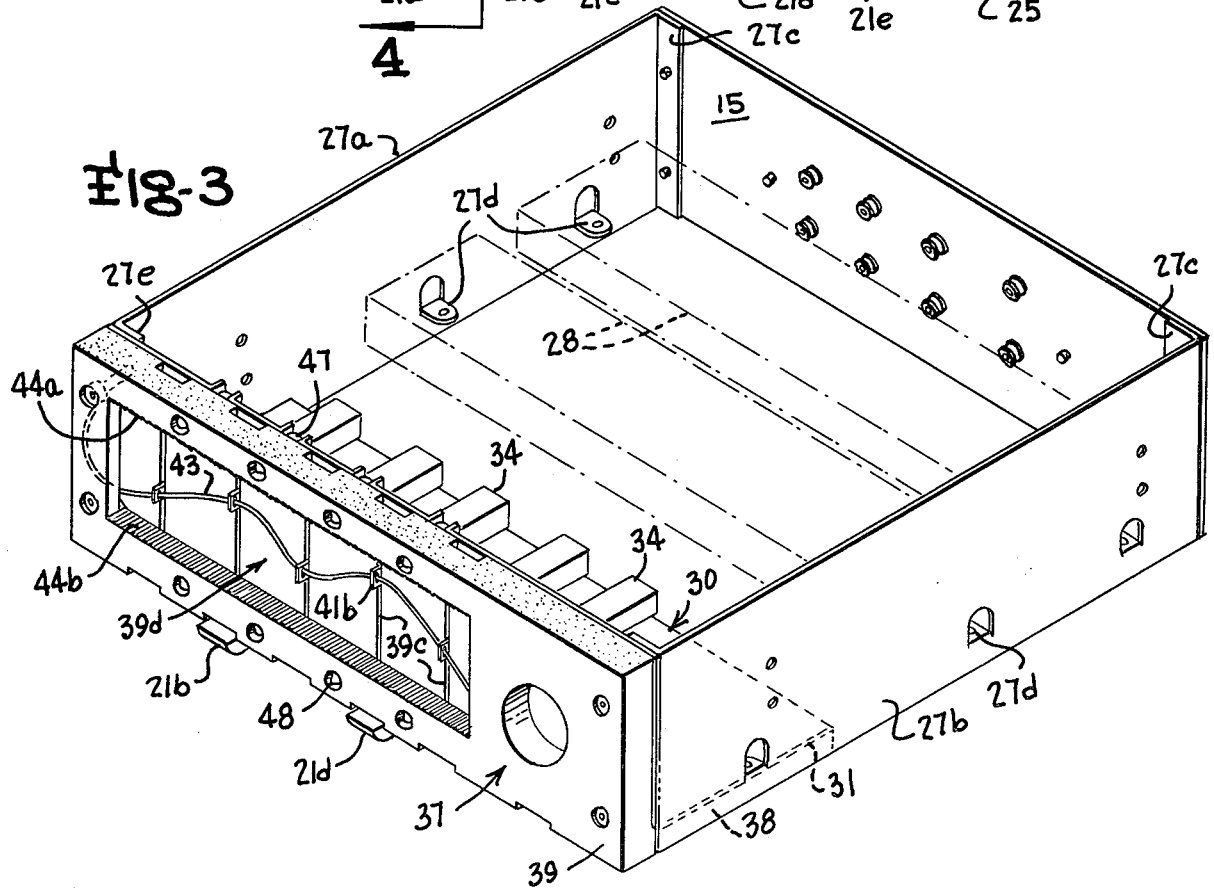
FIG. 3 is a perspective view with the front panel and case removed.

Referring to the drawings, wherein like reference characters designate corresponding parts throughout the several figures, the response tracer amplifier with graphic display of frequency response characteristics is indicated generally by the reference character 10 and is housed in a generally rectangular box-like case or cabinet 11, which when adapted primarily for automobile use as a multichannel power booster for an automobile stereo radio system or the like is relatively shallow vertically so that the overall size of the unit is only about 2" vertically by slightly over 6" in width and depth, in one example, suitable to be mounted beneath the automobile dashboard or at a similar location. As shown in the drawings, the amplifier case has vertical side walls 12, a top wall 13, a bottom wall 14 and a rear wall 15, defining a box-like cabinet which is forwardly closed by a front wall or panel member 16, which may be a molded plastic escutcheon plate or panel. In the illustrated embodiment, the front wall or panel member 16 has a viewing window or display screen portion 17 of rectangular form extending over most of the width of the front of the case, and a circular control knob 18 journaled in a suitable bearing in the right-hand region of the amplifier case provides a fader control to adjust front to rear speaker volume. The front wall 16 may be injection molded to provide a rearwardly facing rectangular cup-shaped wall having a front panel portion 16a and top, bottom and side rearwardly projecting flanges 16b which may be provided with rabbet-like recesses around the perimeter of the flange portions to receive the forward edges of the case or cabinet 11, which may be a steel wrap cabinet. The graphic display or viewing window 17, through which the audio response curve simulating wire, to be later described, is viewed to display the frequency response curve, may be formed of a clear crystal window 19 fixed in the rectangular opening 17a in the front wall 16 defining the graphic display screen or viewing area 17. The crystal window panel 19 in the illustrated embodiment is provided with silk-screen lining similar to that indicated in FIG. 2 providing the lines simulating a rectangular coordinate graph for the audio frequency spectrum, for example, the alternate vertical lines indicating frequencies of about 60 Hz, 250 Hz, 1000 Hz, 3.5K Hz, and 10K Hz.

Below the graphic screen display area 17 along the bottom of the case or cabinet 11 near the front thereof are a plurality of parallel linear operating controls in the form of push-knob members or finger-pieces 21a to 21e, indicated generally at 21, which are constrained in downwardly opening slide channels or recesses 22a to 22e and have slots, as indicated at 23, aligned with the slot 24 in the associated slide channel 22, in the bottom wall portions of a slide cover member 37 to be later described, to receive downwardly projecting lugs of potentiometers for the frequency bands, serving to guide the control push-knob or slide member 21a-21e in a linear fore and aft or front to rear rectilinear slide path. A main ON-OFF power switch member 25, also formed in the same configuration as the control push-knobs or slide members 21a-21e is also provided below the knob 18 and constrained by a slide channel or recess 22f and an associated slot through which a lug extends downwardly from the power switch into the knob 25, for turning the unit on and off.

The case or cabinet 11 forming the side walls 12, top wall 13 and bottom wall 14 is formed, in the illustrated embodiment, by a pair of mating halves, indicated at 11a and 11b, formed of thin sheet metal in the shape of U-shaped channels with the flanges approaching each other along the sides and meeting at a center plane to form the side walls 12. These two cabinet sheet metal halves 11A,11B, in the illustrated embodiment, enclose an inner cabinet structure formed of sheet metal inner side walls 27a,27b having rear inwardly extending end flanges, such as indicated at 27c provided with tapped openings, for securing the rear wall panel 15 by screw fasteners or the like to the inner side wall members 27a,27b. The side wall members 27a and 27b also have inwardly bent tabs, indicated at 27d, providing mounting tabs for supporting printed circuit boards or panels, indicated generally at 28 carrying the circuitry for the amplifiers or power boosters for the plurality of different frequency channels.

The forwardmost end portions of the inner side wall members 27a,27b also have inwardly bent right-angle mounting flanges, indicated at 27e, tapped to receive screw fasteners, and a right-angle, transversely extending front chassis member 30 laterally spanning the width of the cabinet 11 and having a lower horizontal rearwardly extending bottom wall or flange portion 31 and an upwardly extending vertical front wall or flange portion 32 is fastened to and supported by the inner side wall members 27a,27b by screw fasteners extending through the mounting flanges 27e and through the forwardmost bottom tabs 27d. As illustrated, the front chassis member 30 is provided with a smooth cylindrically curved convex connecting wall portion 33 joining the horizontal bottom wall portion 31 and vertical front wall portion 32 and has a plurality of fore-and-aft or front to rear extending slots 30a at appropriate laterally spaced positions along the horizontal bottom wall portion 31 for passage of a downwardly extending lug 34a on one of the amplitude control potentiometers 34 for each of the respective frequency bands or channels, five of which are provided in the illustrated embodiment. These downwardly projecting lugs 34a pass downwardly through the slots 30a and into complimentary slots 35 in the push-knob members or finger pieces 21a to 21e as later described.

A slide cover member 37, which is of a cross-section resembling a right-angle beam and formed of transparent plastic material in the illustrated embodiment, is disposed in abutment with the downwardly and forwardly facing surfaces of the horizontal and vertical wall portions 31 and 32 of the front chassis member, and comprise a lower horizontal slide cover wall 38 and a vertical front slide cover wall portion 39 having an upwardly facing surface 38a and a rearwardly facing surface 39a and a cylindrically curved concave joining surface 39b conforming to and substantially coextensive with the downwardly facing and forwardly facing surfaces of wall portions 31 and 32 and the curved wall portion 33 of the front chassis member 30. The lower slide cover wall portion 38 has slots 24 therein aligned with the slot 30a of the front chassis member 30 for the five amplitude controlling push-knob members or finger pieces 21a to 21e for the five frequency bands, and the upwardly facing surface 38a and rearwardly facing surface 39a of the slide cover wall members 38 and 39 have a channel recess or guideway 40 therein overlying and communicating with the five slots 24 for the amplitude adjusting push-knob members, to guide flexible slider straps 41 for each of these channel recesses 40. These flexible slider straps 41 may be formed, for example, of molded polypropylene having a width of about 7 millimeters and a length of about 55 millimeters, and be provided with a slot 41a corresponding substantially to the cross-sectional configuration of the slot 35 and of the lug 34a for each of the amplitude adjusting potentiometers 34, so that the lug 34a for the associated potentiometer 34 extends through the associated slot 30a in the lower wall 31 of the front chassis member 30, and thence through the slot 41a of the associated slide strap 41 for the associated channel recess 40, and thence through the associated slot 24 in the lower slide cover wall portion 38 into the slot 35 of the associated sliding knob 21a to 21e. The flexible slider strap 41 is captured in the channel recess or guideway 40 associated therewith between the base wall of the channel recess and the confronting surface portion of the bottom and front wall 31,32 and curved wall portion 33 of the front chassis 30 so that the forwardmost portion of the slide strap 41, which carries an apertured forwardly projecting lug 41b will track up and down vertically in the vertical leg of the channel recess 40 formed in the front slide cover wall portion 39, as the associated one of the slide knobs or pushbuttons 21a–21e and the associated potentiometer lug 34a are moved forwardly and rearwardly through the associated slots 30a and 24.

The vertical front wall portion 38 of the slide cover 37 has a vertically elongated slot 39c extending therethrough in the center portion of the vertical leg of each channel recess 40 through which the apertured lug 41b projects to a position spacing the aperture 41c in the lug immediately forwardly of the front surface of the lower portion 39, for passage of the curve indicating wire 43 through the apertures 41c.

Figure 1:
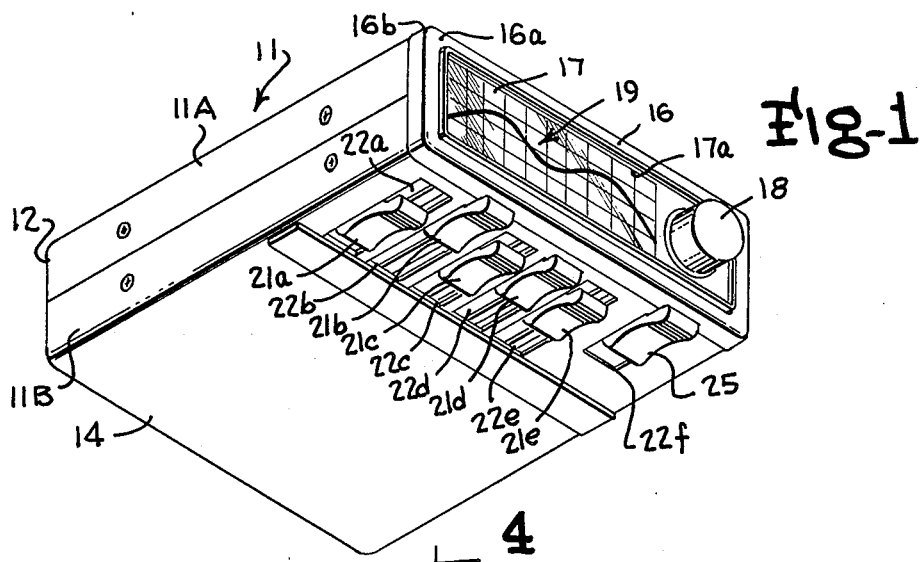
FIG. 1 is a front perspective view from below, showing a response tracer amplifier unit having a graphic amplifier response display, constructed in accordance with the present invention.

The curve indicator wire member 43, in the illustrated embodiment, is formed of Teflon tubing with a piano wire core, and is anchored at one end, for example adjacent the left-hand end as viewed in FIG. 1, by extending the end of the wire through a cut-out provided adjacent the left-hand edge of the front slide cover wall portion 39 and the corresponding left-hand edge portion of the vertical front wall portion 32 of the front chassis 30, with the end of the curve indicator wire member anchored, for example, to one of the fastening screws through the mounting flange 27e of the right-inner side wall member 27a. The curve indicator wire member 43 moves in the forwardly opening recess or channel 39d formed between the upper and lower channel recess side wall portions 44a,44b in the front surface of the front slide cover wall portion 39, and is captured in the apertures 41c of the apertured lugs 41b of each of the five slide straps 41, so that as the lug portions 41b of the slide straps move upwardly or downwardly in accordance with the position of the associated slide knob or pushbutton member 21a and potentiometer 34 fore-and-aft along the associated slot 24, the curve indicator wire 43 will be located relative to the graph imaged on the front of the viewing window or screen 19 to indicate the approximate configuration of the graphic curve for the frequency response characteristics of the amplifier or power booster established by the pushbutton settings.

As is more readily seen in FIG. 6, the upper and lower edge portions of the front wall portion 32 of the front chassis member 30 is provided with lamp receiving openings or cut-outs 47 which are preferably flanged at the sides of the openings to serve as mounts for the base or socket portions of miniature lamps 48 which project forwardly of the front surface of the front wall portion 32 to overlie the upper and lower channel recess side wall portions 44a and 44b in the front slide cover wall portion 39 for illuminating the recess or channel 39d and the curve indicator wire 43 therein. Also, the channel recess side wall portions 44a and 44b may be formed in a zig-zag or sawtooth type pattern serving as light defuser formations along the upper and lower wall portion 44a and 44b.

While the particular example herein described in detail involves the linking of the slidable push-knobs or finger-pieces 21a–21e to the curve indicator wire 43 by means of the flexible slider strap member 41 to translate the horizontal fore-and-aft or front to rear directional movement of the push-knobs to vertical movement of the lug portion 41b of the slider strap, it will be appreciated that other means for achieving vertical adjustment of the curve indicator wire at locations corresponding to the slider strap lugs 41b, or similar locations, responsive either to fore-and-aft pushbutton members or to rotatable knobs such as may be used with potentiometers having rotatable adjustment shafts. For example, rotatable potentiometer adjustment knobs for the different frequency bands may have a pinion and worm gear drive, or bevel gear and worm gear drives or other known direction translating mechanisms linking the potentiometer adjusting member for each band regulating potentiometer to a vertically movable member positioning the curve indicating wire at the proper frequency location to cause the curve indicator wire 43 to assume the proper configuration indicating graphically the frequency response characteristics to which the amplifier is set by the potentiometer adjusting members.

I claim:

1. A response tracer amplifier unit having graphic display of frequency response characteristics of output signals from an audio frequency source, comprising an amplifier cabinet housing audio amplifier circuitry for variably amplifying the audio signals at plural predetermined frequency bands in the audio spectrum, a manually adjustable tone control for each of the respective frequency bands for varying the signal amplification at each associated band, a graphic display window panel in a front wall of the cabinet having laterally spaced markings identifying graph-like positions for selected frequencies over most of the audio frequency spectrum, means supporting a continuous flexible curve indicator wire transversely spanning a face of said window panel for vertical movement of portions of the wire corresponding to locations of said frequency bands in a frequency response curve for the amplifier, and flexible motion translating means between each of said adjustable tone controls and said portions of the curve indicator wire for moving said portions of the wire vertically up and down responsive to manual adjustment of the tone controls for the associated frequency bands in a manner to shape the wire to indicate generally a frequency response curve for the audio spectrum including said frequency bands.

2. A response tracer amplifier having graphic display of frequency response characteristics of output signals from an audio frequency source, comprising an amplifier cabinet housing audio amplifier circuitry for variably amplifying the audio signals at plural predetermined frequency bands in the audio spectrum, a manually adjustable tone control for each of the respective frequency bands for varying the signal amplification at each associated band, a graphic display window panel in a front wall of the cabinet having laterally spaced markings identifying graph-like positions for selected frequencies over most of the audio frequency spectrum, means supporting a continuous flexible curve indicator wire transversely spanning a face of said window panel for vertical movement of portions of the wire corresponding to locations of said frequency bands in a frequency response curve for the amplifier, motion translating means between each of said adjustable tone controls and said portions of the curve indicator wire for moving said portions of the wire vertically up and down responsive to manual adjustment of the tone controls for the associated frequency bands in a manner to shape the wire to indicate generally a frequency response curve for the audio spectrum including said frequency bands, the plurality of frequency band tone controls being push-knob members, said cabinet having guideway formations supporting the push-knob members for rectilinear front-to-rear movement to adjust the amplifier response for the associated frequency bands, and said motion translating means having a horizontally movable portion coupled to the associated push-knob members and a vertically movable portion coupled to the associated band signifying portions of said wire.

3. A response tracer amplifier as defined in claim 2, wherein the translating means comprises an elongated flexible slider strap for each tone control and means defining a guideway for the strap member capturing the strap for a longitudinal sliding movement therein and shaping the strap to a changeable substantially right angle profile.

4. A response tracer amplifier unit as defined in claim 3, wherein said means forming the guideway for said slider strap comprises a front substantially right angular front cover member having front and bottom flange walls to capture and guide said slider straps and a companion right angular backing plate member nested rearwardly against confronting rear and upper faces of said flange walls, the front cover member having slider channel recesses in said rear and upper faces at the positions for the flexible slider straps for shaping the slider straps in right angular configurations providing an upwardly extending front vertical portion and rearwardly extending lower horizontal portion joined by a cylindrically curved midportion and coacting with the confronting surfaces of said backing plate member to maintain the strap captured in said channel recesses.

5. A response tracer amplifier having graphic display of frequency response characteristics of output signals from an audio frequency source, comprising an amplifier cabinet housing audio amplifier circuitry for variably amplifying the audio signals at plural predetermined frequency bands in the audio spectrum, a manually adjustable tone control for each of the respective frequency bands for varying the signal amplification at each associated band, a graphic display window panel in a front wall of the cabinet having laterally spaced markings identifying graph-like positions for selected frequencies over most of the audio frequency spectrum, means supporting a continuous flexible curve indicator wire transversely spanning a face of said window panel for vertical movement of portions of the wire corresponding to locations of said frequency bands in a frequency response curve for the amplifier, motion translating means between each of said adjustable tone controls and said portions of the curve indicator wire for moving said portions of the wire vertically up and down responsive to manual adjustment of the tone controls for the associated frequency bands in a manner to shape the wire to indicate generally a frequency response curve for the audio spectrum including said frequency bands, the plurality of frequency band tone controls being push-knob members, said cabinet having guideway formations supporting the push-knob members for rectilinear front-to-rear movement to adjust the amplifier response for the associated frequency bands, and said motion translating means comprising an elongated flexible slider strap for each tone control and means defining a guideway for the strap member capturing the strap for longitudinal sliding movement therein and shaping the strap to a changeable substantially right angle profile defining a drive end portion coupled to the associated tone control for horizontal sliding movement therewith and a driven opposite end portion captured for vertical sliding movement and coupled to the indicator wire to vertically position the associated wire portion and having a curved intermediate portion between said end portions of the strap.

6. A response tracer amplifier unit as defined in claim 5, wherein said means forming the guideway for said slider strap comprises a front substantially right angular front cover member having front and bottom flange walls to capture and guide said slider straps and a companion right angular backing plate member nested rearwardly against confronting rear and upper faces of said flange walls, the front cover member having slider channel recesses in said rear and upper faces at the positions for the flexible slider straps for shaping the slider straps in right angular configurations providing an upwardly extending front vertical portion and rearwardly extending lower horizontal portion joined by a cylindrically curved midportion and coacting with the confronting surfaces of said backing plate member to maintain the strap captured in said channel recesses.

7. A response tracer amplifier unit as defined in claim 5, wherein said means forming the guideway for said slider strap comprises a front substantially right angular front cover member having front and bottom flange walls to capture and guide said slider straps and a companion right angular backing plate member nested rearwardly against confronting rear and upper faces of said flange walls, and the front cover member having slider channel recesses in said rear and upper faces at the positions for the flexible slider straps for shaping the slider straps in right angular configurations providing an upwardly extending front vertical portion and rearwardly extending lower horizontal portion joined by a cylindrically curved midportion and coacting with the confronting surfaces of said backing plate member to maintain the strap captured in said channel recesses and the front wall portion of said front cover member having a vertical slot therethrough at each of said channel recesses for passage of a forwardly extending projection from the driven portion of the associated strap members therethrough to engage and position the adjoining indicator wire portions.

8. A response tracer audio equalizer booster amplifier unit having graphic display of frequency response characteristics for variably boosting the power of output signals from an audio frequency signal source to speakers of a stereo sound system or the like, comprising an amplifier cabinet for housing audio amplifier circuitry for variably boosting the audio signal at a plurality of predetermined frequency bands in the audio spectrum, a plurality of independently manually adjustable slide controls movable along parallel horizontal front-to-rear paths and corresponding to the number of said frequency bands for varying the boosting of the signal at the frequency bands associated with each of the controls, a graphic display window panel in a front wall of the cabinet having markings for identification of the locations of the frequency bands in a frequency response graph-like display, means supporting a continuous flexible curve indicator wire transversely spanning the rear of said window panel for vertical movement of portions of the wires corresponding to the frequency band locations in the graph display, and motion translating flexible coupling members coupled between each of said adjustable controls and said portions of the curve indicator wire for moving said portions of the curve indicator wire vertically up and down responsive to manual adjustment of the controls in a manner to shape the wire to indicate generally the frequency response curve for an audio frequency spectrum including said frequency bands.

9. A response tracer amplifier as defined in claim 8, wherein said cabinet has guideway formations supporting the slide controls for rectilinear front-to-rear movement to adjust the amplifier response for the associated frequency bands, and said flexible coupling members each comprising an elongated flexible slider strap for the associated slide control, and means defining a guideway for the strap member capturing the strap for a longitudinal sliding movement therein and shaping the strap member to a changeable substantially right angle profile having a vertical leg and horizontal leg joined by an arcuate curve portion.

10. A response tracer amplifier as defined in claim 8, wherein said cabinet has guideway formations supporting the slide controls for rectilinear front-to-rear movement to adjust the amplifier response for the associated frequency bands, and said flexible coupling members each comprising and elongated flexible slider strap for the associated slide control, and means defining a guideway for the strap member capturing the strap for a longitudinal sliding movement therein and shaping the strap member to a changeable substantially right angle profile defining a drive end portion coupled to the associated slide control and to an associated potentiometer for its frequency band for normally horizontal sliding movement therewith and a driven opposite end portion captured for vertical sliding movement adjacent the window panel and coupled to the indicator wire to vertical position the associated wire portion and having a curved intermediate portion between said end portions of the strap.

11. A response tracer amplifier unit as defined in claim 9, wherein said means forming the guideway for said slider strap comprises a front substantially right angular front cover member having joined vertical and horizontal flange walls to capture and guide said slider straps and a companion right angular backing plate member rearwardly nested against confronting faces of said flange walls, the cover member having slider channel recesses in the faces of the flange walls confronting the backing plate member at the positions for the flexible slider straps for shaping the slider straps in right angular configurations providing an upwardly extending front vertical portion and rearwardly extending lower horizontal portion joined by a cylindrically curved midportion and coacting with the confronting surfaces of said backing plate member to maintain the strap captured in said channel recesses.

* * * * *